United States Patent [19]

Boyer

[11] Patent Number: 5,257,547
[45] Date of Patent: Nov. 2, 1993

[54] AMPLIFIED PRESSURE TRANSDUCER

[75] Inventor: Gregory S. Boyer, Freeport, Ill.

[73] Assignee: Honeywell Inc., Minneapolis, Minn.

[21] Appl. No.: 798,476

[22] Filed: Nov. 26, 1991

[51] Int. Cl.$^5$ ............................. G01L 7/08; G01L 9/06
[52] U.S. Cl. .......................................... 73/756; 73/431;
73/721; 73/727; 338/4
[58] Field of Search .................. 73/706, 720, 721, 726,
73/727, 717, 718, 719, 722, 723, 724, 725, 728,
756, 431; 338/4; 361/283

[56] References Cited

U.S. PATENT DOCUMENTS

| | | | |
|---|---|---|---|
| 4,276,583 | 6/1981 | Tominaga et al. | 338/4 |
| 4,287,501 | 9/1981 | Tominaga et al. | 338/42 |
| 4,295,117 | 10/1981 | Lake et al. | 338/4 |
| 4,314,225 | 2/1982 | Tominaga et al. | 338/4 |
| 4,333,349 | 6/1982 | Mallon et al. | 73/708 |
| 4,797,007 | 1/1989 | Elmore, III | 73/756 |
| 4,850,227 | 7/1989 | Luettgen et al. | 73/756 |
| 4,879,903 | 11/1989 | Ramsey et al. | 73/756 |
| 4,928,530 | 5/1990 | Lehto et al. | 73/756 |
| 5,090,247 | 2/1992 | Liebgen | 73/727 |
| 5,101,665 | 4/1992 | Mizuno | 73/721 |
| 5,134,887 | 8/1992 | Bell | 73/718 |

OTHER PUBLICATIONS

Advertising information on pressure sensor "Model XT".

Primary Examiner—Donald O. Woodil
Attorney, Agent, or Firm—William D. Lanyi

[57] ABSTRACT

A pressure transducer is provided which incorporates numerous stress reducing characteristics. A pressure sensor is mounted to a ceramic plate with a buffer plate there between to isolate the pressure sensor from stresses that could be transmitted through the ceramic plate. The ceramic plate is necessary for the purpose of supporting a plurality of electronic components which comprise an amplification and compensation circuit. The ceramic plate is separated from all parts of its housing except a minimal central surface on a support boss which provides the support for the pressure sensitive device. Electrical communication between conductive paths on the ceramic plate and terminals extending through the housing is provided by flexible electrical conductors. A cover is attached to the housing with snap acting contact which further isolate the housing from the cap. The housing and cap are constructed to support the housing in a noncontact association with an external device when feet on the cap are attached directly to the external device. This offset positioning of the housing with respect to the external component further isolates the housing from sources of external stress. The combined stress isolated techniques used in the present invention permit a pressure sensor to measure very low pressures with a high degree of sensitivity without introducing measurement problems that would otherwise be incumbent in this type of transducer because of externally caused stresses transmitted from external forces and originating in the transducer because of thermal stress.

36 Claims, 8 Drawing Sheets

AMPLIFIED PRESSURE TRANSDUCER

BACKGROUND OF THE INVENTION

1. Field of the Invention

The present invention relates generally to pressure transducers and, more particularly, to pressure transducers which incorporate stress reducing configurations to permit the measurement of extremely low pressures while avoiding measurement errors which can be caused by stresses that result from temperature changes or external forces exerted on the transducer.

2. Description of the Prior Art

Many different types of pressure transducers are known to those skilled in the art. One particular type of pressure transducer utilizes a silicon substrate having a diaphragm portion that is flexible and responsive to pressure on the surface of the diaphragm. In these types of pressure transducers, it is very well known to provide a plurality of piezoresistive devices on the diaphragm. These piezoresistive devices are usually connected in a bridge arrangement so that changes in resistance of the devices can be electrically determined from stress induced changes in resistivity of the piezoresistive devices. When the diaphragm of the substrate is deformed in response to the pressure on the diaphragm, the piezoresistive devices experience a stress which alters their resistive characteristics. Measurement of the resistance of the piezoresistive devices permits the magnitude of deformation of the diaphragm to be determined which, in turn, allows the pressure on the diaphragm to be calculated. If the pressure transducer is intended for use in measuring differential pressure, a first pressure is exposed to one side of the diaphragm and a second pressure is exposed to the other side.

U.S. Pat. No. 4,333,349, which issued to Mallon et al on Jun. 8, 1982, describes a particular balancing network for use in association with a piezoresistive semiconductor bridge configuration of the type which is commonly used in pressure sensors. The balancing network comprises a plurality of series resistors connected to the sensing elements in the bridge configuration. Each of the resistors differs from the previous one according to a power of two in order to form a binary ladder arrangement. The individual resistors are associated with terminals to allow the transducer manufacturer to selectively short one or more resistors to provide zero balance compensation. The resistors are located on the nonactive portion of the semiconductor substrate and are fabricated by the same techniques employed for fabrication of the semiconductor piezoresistive sensing elements to assure temperature tracking of the unit with the desired temperature operating range. Although this particular patent describes a specific binary balancing apparatus, the basic concept of employing a plurality of sensing elements, or piezoresistive devices, is very well known to those skilled in the art.

U.S. Pat. No. 4,314,225, which issued to Tominaga et al on Feb. 2, 1982, discloses a pressure sensor which has a semiconductor diaphragm, such as a silicon diaphragm, that is formed with at least one diffused resistor in a surface region on one side thereof. A silicon block, which has the diaphragm, is bonded to the inside of a box-like package such that the diffused resistor is exposed in a vacuum chamber defined in the package and that a fluid pressure can arrive at the back side of the diaphragm through a hole of the package. To minimize unwanted straining of the silicon diaphragm by thermal influences, the package is made of a material such as Mullite whose linear expansion coefficient is close to that of silicon. To prevent an accidental change in the output characteristics of the sensor by the influence of an unintended external force, the package is supported above a base plate by pillar-like lead frames and confined in a space provided by fixing a cap to the base plate. A pressure introduction pipe is attached to either the base plate or the cap.

U.S. Pat. No. 4,295,117, which issued to Lake et al on Oct. 13, 1981, describes a pressure sensor which comprises a silicon chip which has a diaphragm formed therein with piezoresistive strain responsive resistors. The pressure sensor element is mounted in a housing of molded polyester material having a much different temperature coefficient of expansion than silicon chip. The silicon chip is protected from thermally induced and other stresses by a mounting arrangement comprising a glass base secured to the housing by a soft adhesive which largely prevents stress being transmitted from the housing to the base. The base has a short pedestal on which a glass die is mounted which, in turn, supports the silicon chip. The short pedestal adds localized rigidity to the base so that any stresses in the base are taken up outside the region of the pedestal. One face of the glass die is bonded to the base by a relatively soft epoxy to further inhibit stress transmission and the silicon chip is securely bonded to the opposite face of the die. Contacts on the silicon chip are wire bonded to conductors which are insert molded into the housing.

U.S. Pat. No. 4,287,501, which issued to Tominaga et al on Sep. 1, 1981, describes a pressure sensor that comprises a pair of semiconductor diaphragm blocks in which each block has a diaphragm on a front surface of which a diffused resistor is formed as a pressure sensitive element. They are confined within a sealed hollow package and bonded at their circumferential supports to opposite inside surfaces of the package such that the front surfaces of the diaphragms are positioned within a vacuum space within the package. This package is provided with holes through which fluid pressures subject to measurement are introduced so as to arrive at the back surfaces of the diaphragms.

U.S. Pat. No. 4,276,533, which issued to Tominaga et al on Jun 30, 1981, describes a pressure sensor assembly which includes a silicon diaphragm block that has a diaphragm at an eccentric position thereof with a diffused resistor formed as a pressure sensitive element on front surface of the diaphragm. A silicon support plate is bonded to the diaphragm block so as to cover a back surface of the diaphragm. A silicon support plate is bonded to the diaphragm block so as to cover a back surface of the diaphragm. The diaphragm assembly is accommodated within and bonded to the inside of a hollow package at an end portion of the assembly remote from the diaphragm in the direction of extension of the bonded surface of the block and the support plate. The front surface of the diaphragm and the diffused resistor thereon are exposed to a vacuum while a fluid pressure subject to measurement is introduced through a passage extending through the package and the end portion of the assembly bonded to the package so as to arrive at a back surface of the diaphragm.

Many of the pressure sensors known to those skilled in the art employ techniques to reduce the sensitivity of the pressure sensor to stresses which are either induced through temperature changes or external forces exerted on the sensor. However, the problem of protecting a pressure sensor from stress is significantly exacerbated when the pressure sensor is used in association with an amplification and compensation circuit within the same housing structure. In most situations, the amplification and compensation circuit is disposed on a substrate, such as a ceramic plate, which is connected in electrical communication with both the piezoresistive devices on the diaphragm of the pressure sensor and terminals which permit electrical signals and electrical power to pass between the circuit on the ceramic plate and a device which is external to the pressure transducer. In most cases, the housing package has a coefficient of thermal expansion which is significantly different than that of the ceramic plate which, in turn, has a coefficient of thermal expansion which is significantly different than that of the diaphragm. Therefore, changes in temperature are likely to cause unequal changes in size for the various components of the pressure transducer which, in turn, causes stresses in the diaphragm which can result in inaccuracies and inconsistencies. In addition, the pressure transducer package is usually mounted to another device, such as a printed circuit board, for use in a larger system. When the package is mechanically attached to the other device, the attachment process can induce additional stresses in the package which can be transmitted to the silicon diaphragm and its piezoresistive devices. All of these factors can lead to improper operation of the pressure transducer.

When the pressure transducer is intended for use in measuring very low pressures, the problems described above are significantly more disadvantageous. Therefore, it would be beneficial if a pressure transducer with an amplification and compensation circuit is provided in a way which reduces the effect of temperature induced stresses and stresses caused by external forces.

SUMMARY OF THE INVENTION

A preferred embodiment of the present invention comprises a housing which has a base surface and a plurality of walls that are attached to the base surface. A support boss is attached to the base surface of the housing in noncontact association with the walls of the housing. A pressure sensitive device is attached to the support boss with the support boss being disposed in contact with a central portion of a first surface of the pressure sensitive device. The pressure sensitive device is supported in noncontact association with the plurality of walls. A first means is provided for connecting the pressure sensitive device in fluid communication with a first region outside the housing and a plurality of electrically conductive terminals is rigidly attached to the housing, extending from a first position proximate the pressure sensitive device to a second position external to the housing. A cover is attached to the housing to enclose the pressure sensitive device between the housing and the cover. The connection between the housing and the cover is provided by a plurality of snap acting latches which attach the cover to the housing. Since all of the stress sensitive components are attached to the housing, mounting devices are attached to the cover in such a way that mounting the transducer cover to another object disposes the housing in noncontact association with that external object.

In a preferred embodiment of the present invention, the pressure sensitive device comprises a ceramic member on which the amplification and compensation circuit components are disposed. In addition, a pressure sensor is disposed on the ceramic member wherein the pressure sensor comprises a silicon diaphragm with one or more piezoresistive components disposed thereon. The pressure sensitive device further comprises a cap which is disposed on a second surface of the ceramic member while a first surface of the ceramic member is attached to the boss of the housing. The pressure sensor is disposed between the cap and the second surface of the ceramic member. Between the pressure sensor and the ceramic member, a buffer plate is disposed for the purpose of further isolating the silicon diaphragm from the housing.

Electrically conductive pads on the ceramic member are connected in electrical communication with the terminals by a plurality of flexible conductors so that stresses can not be transferred from the insert-molded terminals to the ceramic member. When the ceramic member is supported on the boss of the housing, the edges of the ceramic member are disposed in noncontact association with the walls of the housing and only a minimal central portion of the first side of the ceramic member is in physical contact with the boss. The rest of the ceramic member extends from the central portion in noncontact association with all other members of the pressure transducer. The first connecting means comprises a conduit which extends from a region outside the pressure transducer, through the housing and the boss, to a cavity formed in a buffer plate, which will be described in greater detail below, so that the conduit is in fluid communication with a first side of the silicon diaphragm.

In a preferred embodiment of the present invention, a second conduit, or connecting means, is provided to connect a second region external to the pressure transducer in fluid communication with a second side of the silicon diaphragm. The second conduit extends through a portion of the housing and through the boss. In addition, the second conduit extends through an opening in the ceramic member to a region under the cap which is in fluid communication with the second side of the silicon diaphragm. When a second conduit is used, the pressure transducer can be utilized as a differential pressure transducer.

In a preferred embodiment of the present invention, the ceramic member is attached to the boss with a deformable, or flexible, adhesive compound In a most preferred embodiment of the present invention, this deformable compound can be a room temperature vulcanizable (RTV) material which is available in commercial quantities from General Electric Corporation. The buffer plate is attached to the second side of the ceramic member and to the pressure sensor with another deformable adhesive such as a heat curable silicone adhesive which is available in commercial quantities from the Dow Corning Corporation.

In a preferred embodiment of the present invention, the two fluid conduits are provided to connect two pressure sources to opposite sides of a silicon diaphragm in order to provide a differential pressure sensor. The cover of the present invention is particularly designed to support the pressure transducer in a manner which avoids direct physical contact between the housing of the pressure transducer and an external device, such as a printed circuit board, to which the pressure transducer is attached.

BRIEF DESCRIPTION OF THE DRAWINGS

The present invention will be more fully understood from a reading of the Description of the Preferred Embodiment in conjunction with the drawing, in which.

DESCRIPTION OF THE PREFERRED EMBODIMENT

Figure 1:
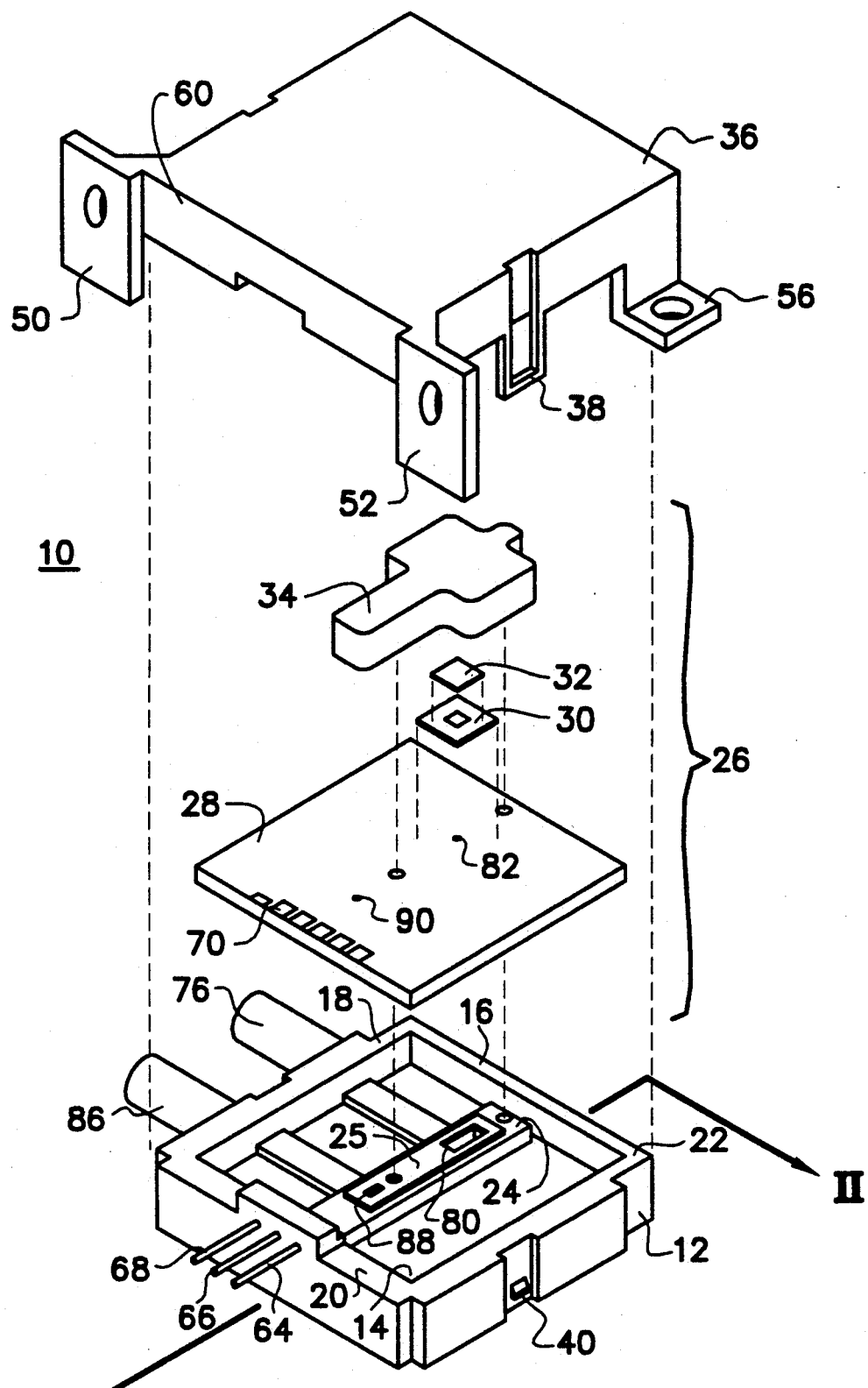
FIG. 1 shows an exploded perspective view of a pressure transducer made in accordance with the present invention.

Throughout the Description of the Preferred Embodiment, like components will be identified with like reference numerals.

The pressure transducer of the present invention is generally identified by reference numeral 10 and is shown in FIG. 1 in an exploded perspective view. In a preferred embodiment of the present invention, a housing 12 is provided which has a base surface 14 and a plurality of walls, 16, 18, 20 and 22, attached to the base surface 14 with a raised area 25 extending from the support boss 24. A support boss 24 is attached to the base surface 14.

A pressure sensitive device, identified by reference numeral 26 in FIG. 1, comprises a ceramic plate 28, a buffer plate 30 and a silicon pressure sensor 32. These components of the pressure sensitive device 26 will be described in greater detail below. The pressure sensitive device 26 also comprises a cap 34 which is disposed on the ceramic plate 28 with the buffer plate 30 and the silicon pressure sensor 32 disposed between the cap and the ceramic plate.

A cover 36 is attachable to the housing 12 by a plurality of snap acting connectors 38, or latches, which are shaped to receive tabs 40 in locking association therewith. When the cover 36 is pushed down onto the housing 12, the snap acting connector 38 is deformed slightly to permit the tab 40 to slip into the opening of the connector 38. As the cover 36 is pushed further down onto the housing 12, the tab 40 moves entirely within the opening of the connector 38 and the connector snaps back into its normal position to capture the tab and retain the cover 36 on the housing.

With continued reference to FIG. 1, it can be seen that the cover 36 comprises a plurality of fastening devices that permit the cover 36 to be attached to an external device such as a printed circuit board. A first pair of feet, 50 and 52, are disposed at one end of the cover 36 to permit the pressure transducer to be mounted in one position relative to an external device. A second pair of feet, 54 and 56, are attached to another side of the cover 36 to permit the pressure transducer to be mounted in a different position relative to an external device such as a printed circuit board. Both pairs of feet are particularly located so that the housing 12 is in noncontact relation with the external device when the cover is mounted to the external device through the use of either pair of feet. For example, when feet 50 and 52 are used to mount the transducer to an external device, the cover 36 is shaped to provide a clearance 60, which is shown more clearly in FIGS. 6 and 7, between a surface of the transducer and the contact surfaces of feet 50 and 52. When the cover 36 is attached to the housing 12, the housing is supported by the cover in such a way that it does not contact the external device to which the transducer is attached. A similar technique is used when the other pair of feet, 54 and 56, is used to attach the transducer to an external device.

Also shown in FIG. 1 is a plurality of terminals which are identified by reference numerals 64, 66 and 68. These terminals are rigidly attached to the housing 12 and extend through the housing to provide electrical communication between an external device and the ceramic plate 28 and, more particularly, the plurality of conductive pads 70 which are disposed on the ceramic plate in electrical communication with a plurality of components used to provide the amplification and compensation circuitry for the pressure transducer 10. As will be described in greater detail below, the terminals are not in physical contact with the ceramic plate but, instead, are disposed proximate the conductive pads 70 to permit flexible conductors to be attached to both the terminals and the pads to provide electrical communication therebetween. This technique permits electrical communication between the ceramic plate 28 and external devices without allowing stress to be transmitted from the terminals to the ceramic plate.

With continued reference to FIG. 1, a first means for connecting the pressure sensitive device 26 in fluid communication with a first region external to the transducer is partially identified by reference numeral 76. As can be seen, this first connecting means 76, or conduit, extends from a position external to the housing 12 through a portion of the housing and through a portion of the boss 24. As illustrated in the other figures and as will be described in greater detail below, this first conduit extends through an opening 80 in the boss 24 and a first opening 82 through the ceramic plate 28. The conduit continues through a cavity in the buffer plate 30 to a first side, or cavity side, of the silicon diaphragm in the pressure sensor 32. A second fluid connecting means 86, or conduit, is provided which extends through a second opening 88 in the boss 24 and a second opening 90 in the ceramic plate 28. This second conduit is connected in fluid communication with a region under the cap 34 which is above the pressure sensor 32 and in fluid communication with a second, or active, side of the diaphragm. Therefore, the two conduits, 76 and 86, are connected in fluid communication with opposite sides of the silicon diaphragm to permit the transducer to be operated as a differential pressure transducer. However, it should clearly be understood that by connecting the two sides of the pressure transducer diaphragm in fluid communication with alternative sources of pressure, the transducer of the present invention can be applied in many different and alternative ways.

When the ceramic plate 28 is attached to the raised area 25 of the boss 24, a flexible adhesive material is used to provide this attachment. The flexibility, or deformability, of the adhesive provides a stress isolation member that inhibits the transmission of stress from the boss 24 and raised area 25 to the ceramic plate 28 while also inhibiting leakage from the first and second conduits at the region where the ceramic plate 28 joins the raised area 25 of the boss 24. In addition, as will be described in greater detail below, the ceramic plate 28 is supported on the raised area 25 in a manner which prevents contact between the edges of the ceramic plate and the walls of the housing 12. This also inhibits stress from being transmitted from the walls of the housing to the ceramic plate. Only the central region of the plate is in physical contact with any portion of the housing. In addition, a flexible adhesive is used to attach the buffer plate 30 to the ceramic plate 28 and is also used to attach the pressure sensor 32 to the buffer plate 30. Therefore, between the boss 24 and the pressure sensor 32, three layers of flexible adhesive provide significant stress isolation between the stress sensitive diaphragm of the pressure sensor 32 and the housing 12. It is particularly important to inhibit stress from affecting the pressure sensor 32 in pressure transducers which are intended to measure very low magnitudes of pressure and in pressure transducers which utilize amplification and compensation circuitry within the transducer. If high magnitudes of pressure are to be measured by a transducer, relatively low magnitudes of stress, caused by either temperature changes or external forces, can be tolerated and appropriate compensation can be achieved. However, when the pressure transducer is intended to measure very low magnitudes of pressure, externally caused stresses can significantly affect the accuracy and consistency of the pressure measurements and any such errors will be amplified. In addition, if the pressure transducer is intended to provide an unamplified signal at the terminals, such as terminals 64, 66 and 68, the induced stresses can be more easily compensated and inhibited because the transducer does not require the use of the circuitry which must be mounted on an appropriate platform such as the ceramic plate 28. However, when a ceramic plate 28 is required to support the amplification and compensation circuitry, its presence introduces the additional potential for transmission of stresses in several ways. First, the coefficient of thermal expansion of the ceramic plate 28 is most likely to be significantly different than the coefficient of thermal expansion of the pressure sensor 32. In addition, its coefficient of thermal expansion is also likely to be significantly different than that of the housing 12. Stresses introduced into either the ceramic plate 28 or the pressure sensor 32 can cause inaccuracies in the output from the transducer. Furthermore, since the terminals of the housing are required to be electrically connected to the pads 70, forces that are exerted on the terminals can be transferred through the ceramic plate to the pressure sensor if preventative measures, such as will be described below in conjunction with FIG. 3, are not taken.

Figure 2:
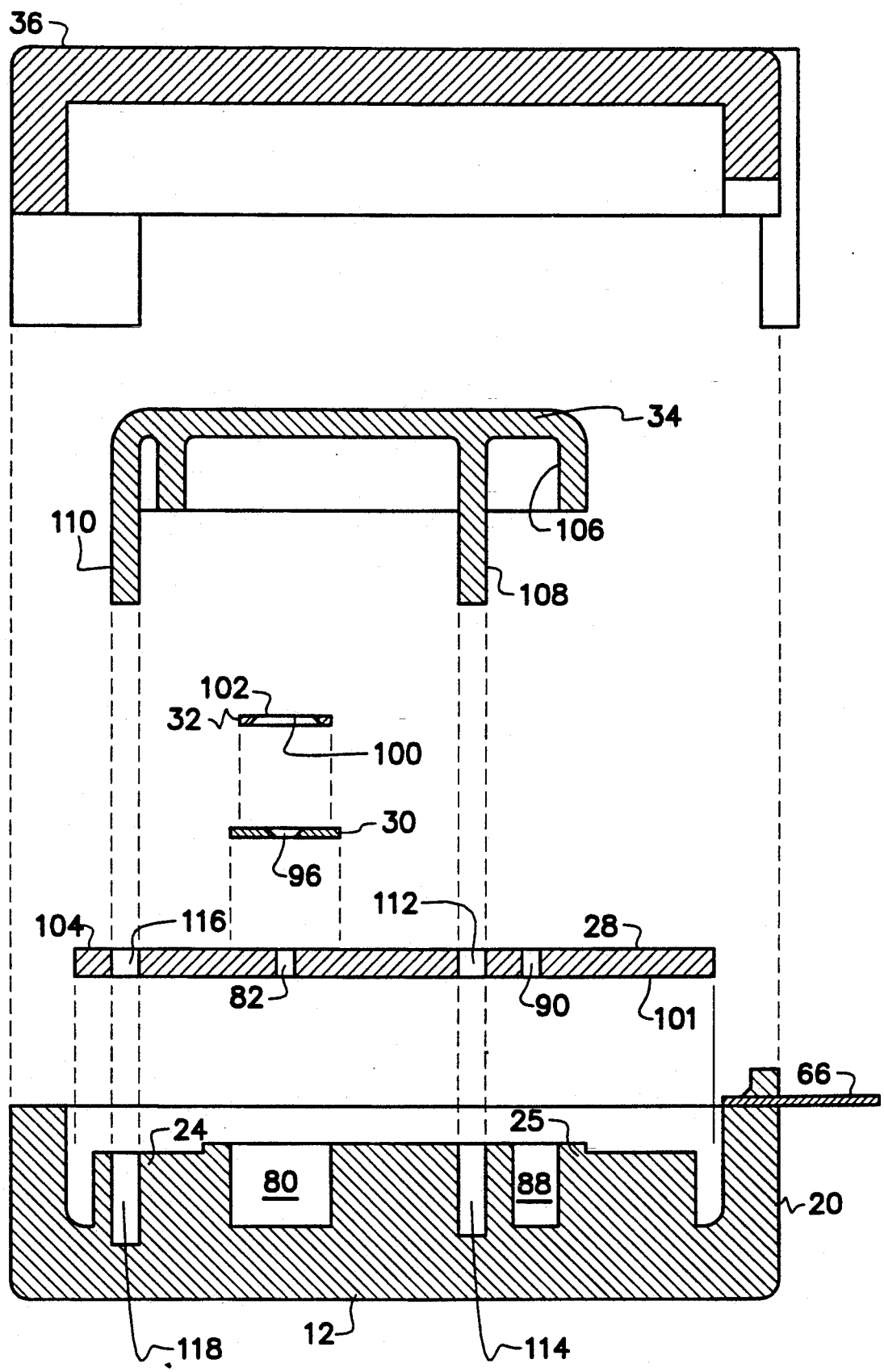
FIG. 2 shows an exploded view of the present invention.

FIG. 2 shows an exploded sectional view of the exploded assembly of FIG. 1. The housing 12 is shown with walls 16 and 20 with terminal 66 attached to wall 20 of the housing 12 and extending through a portion of the housing. The ceramic plate 28 is shown with the first opening 82 and second opening 90 extending therethrough. The buffer plate 30 has a cavity 96 extending through it to provide fluid communication between opening 82 of the first conduit 76 and a first, or cavity, side 100 of the diaphragm of the pressure sensor 32. The diaphragm also has a second, or active, side 102 which, as will be described below, is disposed in fluid communication with the second conduit 86. It should be understood that the diaphragm of the pressure sensor 32 is extremely thin and responsive to changes in relative pressure between its two opposite surfaces. It should also be understood that the diaphragm of the silicon sensor 32 typically has several piezoresistive components disposed on the diaphragm, usually by a diffusion process. Because of the extremely small dimensions of the diaphragm, the piezoresistive devices are not illustrated in FIG. 2. However, these devices are very well known to those skilled in the art and are schematically illustrated in the prior art described above.

The first side 101 of the ceramic plate 28 is disposed on a raised area 25 of the boss 24. The cap 34 is disposed on a second surface 104 of the ceramic plate 28 to enclose the pressure sensor 32 within a volume contained by surface 106 of the cap 34. As shown in FIG. 2, the cap 34 has a first leg 108 and a second leg 110 which are shaped to be received through holes in the ceramic plate and in holes of the boss 24. As illustrated by the dashed lines in FIG. 2 the first leg 108 extends through opening 112 into hole 114 and the second leg 110 extends through opening 116 into hole 118. The first and second legs, in cooperation with the openings and holes described above, align the cap 34 and the ceramic plate 28 with the boss 24 in such a way that all of the holes and openings are properly positioned to form the first and second conduits described above. In other words, because of this proper alignment, a fluid can pass from hole 80 in the boss 24 through opening 82 and cavity 96 to be in fluid communication with the first, or cavity, side 100 of the diaphragm. Similarly, a fluid can pass from hole 88, through opening 90, to the region under the cap 34 defined by the inner surface 106 in fluid communication with the second, or active, side 102 of the diaphragm.

Figure 3:
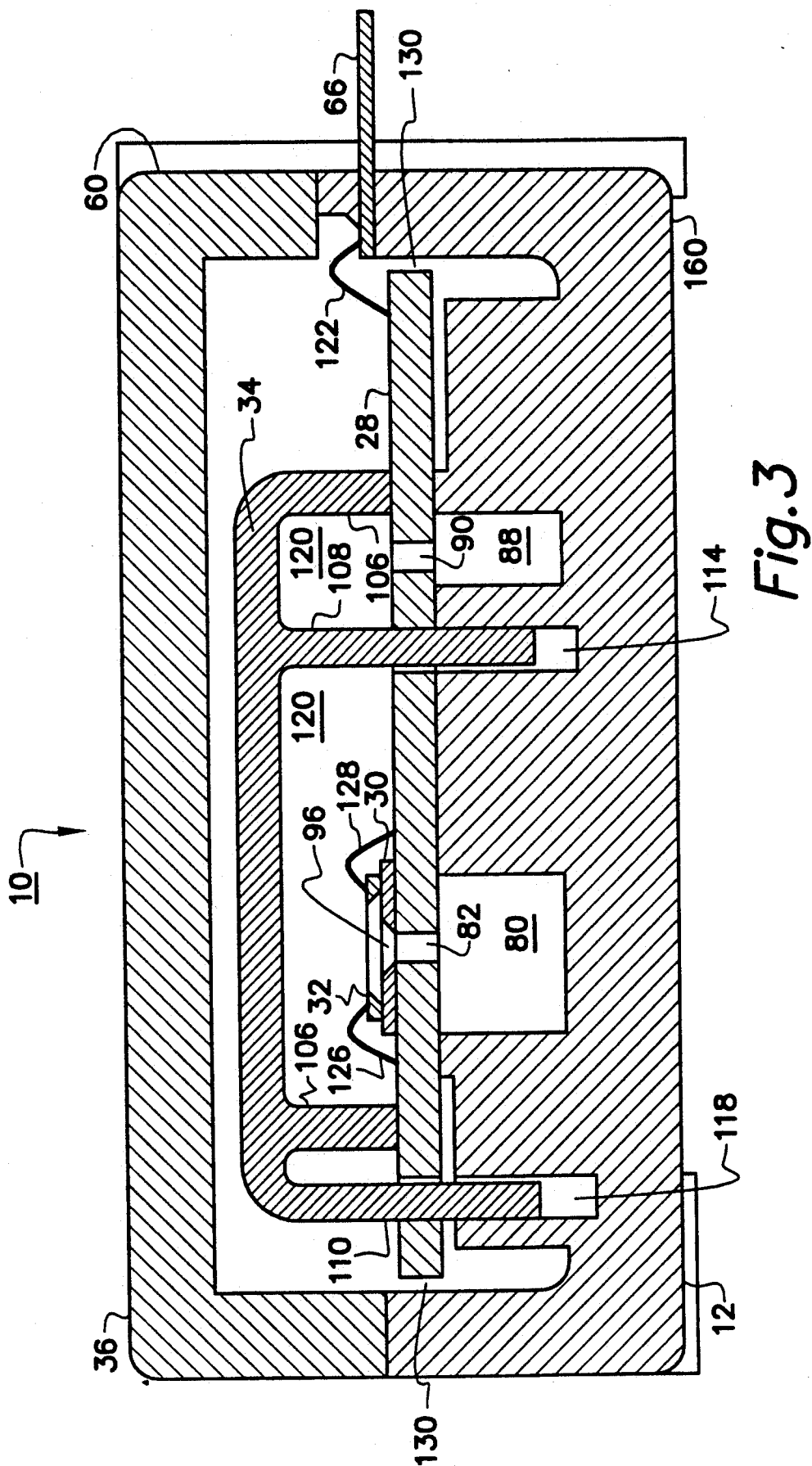
FIG. 3 shows a sectional view of a pressure transducer made in accordance with the concepts of the present invention.

FIG. 3 shows the pressure transducer 10 of the present invention in an assembled arrangement. It should be understood that the assembled configuration of FIG. 3 illustrates the components of FIG. 2 arranged in cooperating association with each other. The illustration of FIG. 3 shows the first conduit which comprises hole 80, opening 82 and cavity 96 which are all in fluid communication with the first, or cavity, side 100 of the diaphragm. FIG. 3 also shows the second conduit which comprises hole 88, opening 90 and the region 120 which is defined by the surface 106 of the cap 34. This second conduit is in fluid communication with the second, or active, side 102 of the diaphragm.

With continued reference to FIG. 3, it should be noted that the terminal 66 is not in physical contact with the ceramic plate 28 but, instead, is spaced apart from the ceramic plate 28. This prevents the transfer of stress from the terminal 66 to the ceramic plate and the pressure sensor 32 which is disposed thereon. Electrical communication is provided by the flexible conductor 122 which is wirebonded to both of these components. Although the conductive pad 70 is not shown in FIG. 3, it should be understood that the flexible conductor 122 is disposed in electrical communication with a preselected conductive pad. It should also be understood that although only one terminal 66 is shown in FIG. 3, a preferred embodiment of the present invention incorporates a plurality of terminals which are each connected in electrical communication with selected ones of the conductive pad 70. FIG. 3 also shows wirebonds 126 and 128 connected between the piezoresistive components on the diaphragm and the circuit components placed on the second surface of the ceramic plate 28.

With continued reference to FIG. 3, it can be seen that a space is provided between the edges of the ceramic plate 28 and the walls of the housing 12. This space is designated by reference numeral 130 in FIG. 3. If the housing expands or contracts because of changes in temperature, space 130 prevents contact between the ceramic plate and the housing and therefore isolates the ceramic plate from stresses that could otherwise be transferred from the housing under these conditions. In addition, since the terminal 66 is not in physical contact with the ceramic plate 28, stresses can not be transferred from the terminals to the ceramic plate when external force is exerted on the terminals, either during a bending operation or during subsequent connection to external devices.

Figure 4:
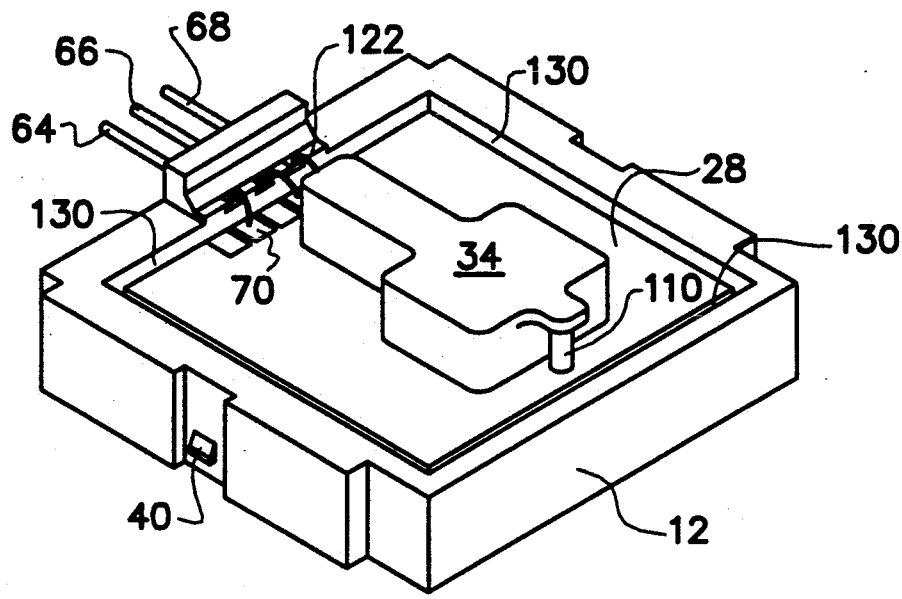
FIG. 4 shows a perspective view of the housing, circuit board, terminals and cap of the present invention.

FIG. 4 shows an assembled transducer made in accordance with the present invention but with the cover 36 removed. As can be seen, a space 130 is provided around the entire periphery of the ceramic plate 28 to separate the plate from the walls of the housing 12. Although no electronic components are shown on the second side of the ceramic plate 28, it should be understood that the space surrounding the cap 34 on the surface of the ceramic plate is intended to contain a plurality of electronic components which comprise the circuitry necessary for amplification and compensation. Those electronic components are disposed on both surfaces of the ceramic plate and are connected in electrical communication with the conductive pads 70 and, through the flexible conductors such as that which is identified by reference numeral 122, to the terminals. The two sides of the ceramic plate are connected in electrical communication with each other by conductive paths extending through the plate.

It should be understood that the total support of the pressure sensitive device 26, which comprises the ceramic plate 28 and the cap 34, is provided by the raised area 25 of boss 24 along a central region underneath the ceramic plate. Although not shown in the view of FIG. 4, the boss is disposed beneath the ceramic plate along an alignment that extends from directly below the second pin 110 of the cap 34 toward the terminals, ending beneath the conductive pad 70. On all sides of the boss 24, the ceramic plate 28 extends in a cantilevered fashion, above the base surface 14 of the housing 12. Therefore, the vast majority of the ceramic plate 28 is in noncontact association with the remaining components of the housing. Therefore, it is significantly isolated from the transfer of stress from the other housing components.

Figure 5:
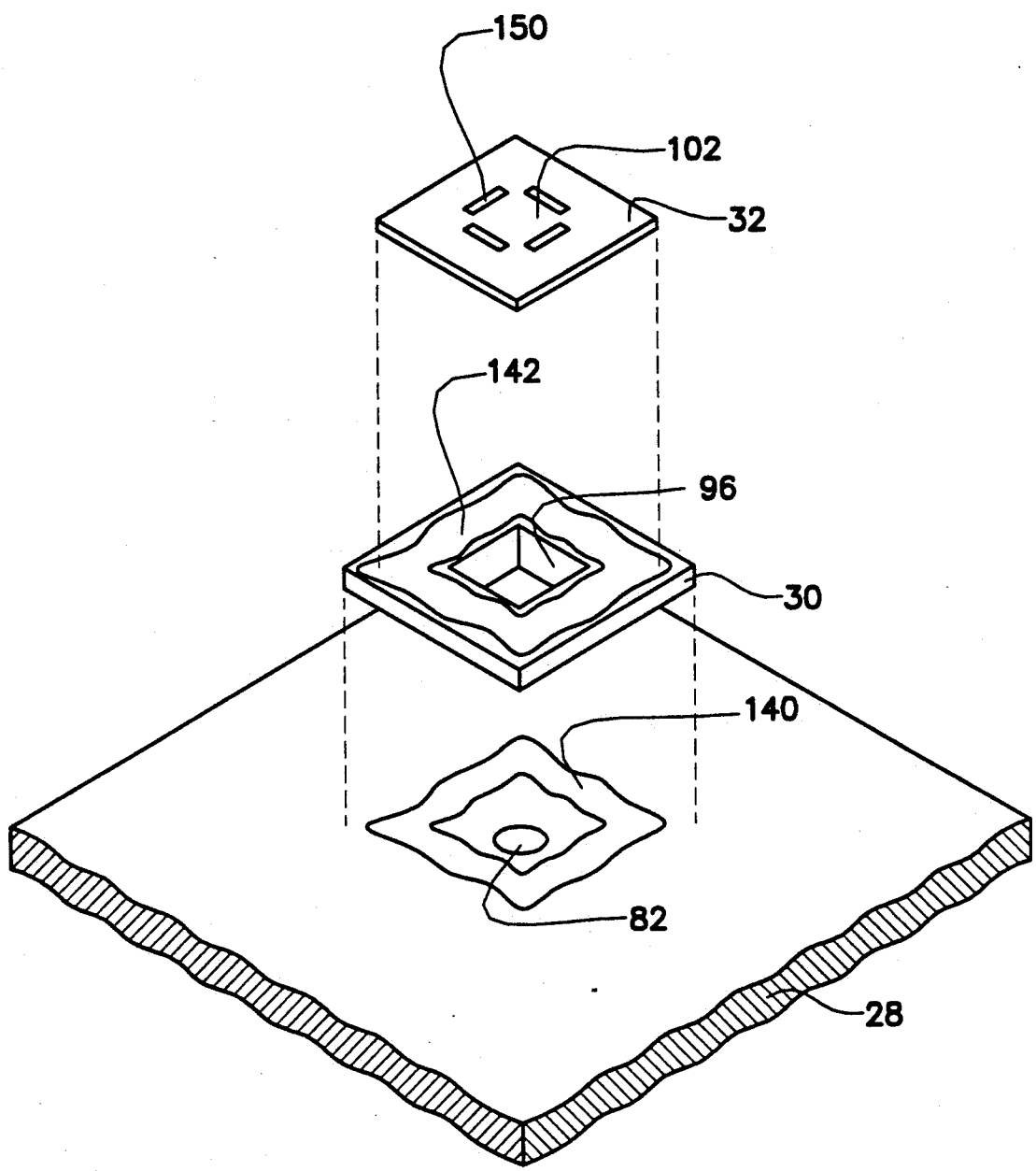
FIG. 5 shows a perspective view of a ceramic plate, the buffer plate and the silicon pressure sensor of the present invention.

FIG. 5 illustrates a portion of the ceramic plate 28, showing only the first opening 82 through the plate. By comparing FIGS. 3 and 5, it can be seen that the buffer plate 30 will be disposed on the second surface of the ceramic plate 28 with its cavity 96 aligned with the first opening 82. In addition, the pressure sensor 32 is disposed on the buffer plate 30 in such a manner that its diaphragm is disposed in fluid communication with both the cavity 96 and the first opening 82. To attach the buffer plate 30 to the second surface of the ceramic plate 28, a flexible adhesive 140 is disposed around the first opening 82 so that the buffer plate 30 is attached to the ceramic plate 28. In addition, the flexible adhesive 142, which can be the same material as adhesive 140, is disposed a surface of the buffer plate 30, around the cavity 96, so that the pressure sensor 32 can be attached to the upper surface of the buffer plate 30. The use of flexible adhesive, 140 and 142, performs two functions that are important to the present invention. First, it seals the components together in such a way that leaks in the first conduit are prevented. Secondly, the flexible nature of the adhesive permits relative movement between the attached components. In other words, expansion of the ceramic plate 28 can occur without causing stress to be transmitted to the buffer plate 30.

In FIG. 5, the second surface 102, or active surface, of the diaphragm is illustrated as having a plurality of piezoresistive devices 150 disposed on it. Although the piezoresistive devices 150 are only shown schematically in FIG. 5, it should be understood that alternative configurations of piezoresistive devices and alternative components can be used to perform the functions required for the operation of a pressure sensor.

Figure 6:
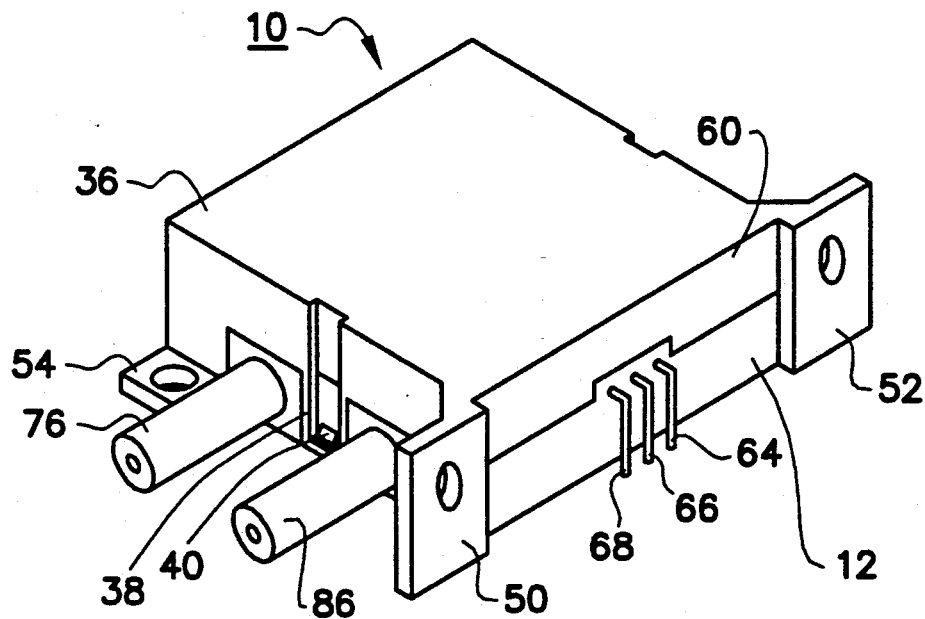
FIG. 6 shows a perspective view of the present invention is an assembled state.
Figure 7:
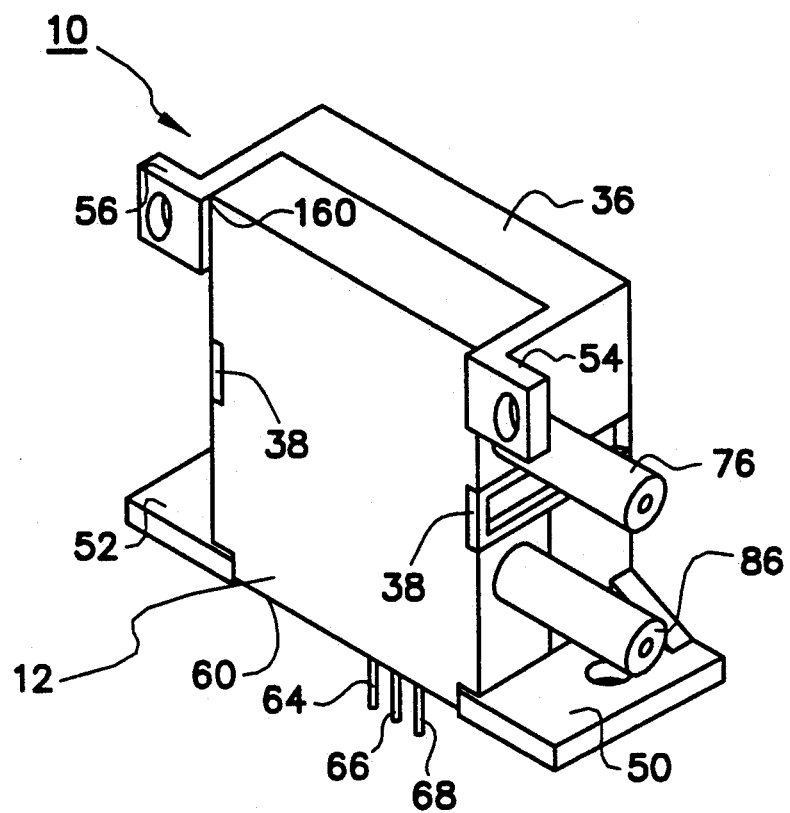
FIG. 7 is an alternative view of the device shown in FIG. 6.

FIG. 6 illustrates the pressure transducer 10 of the present invention in an assembled form with the cover 36 disposed on the housing 12. FIG. 7 also shows another view of the pressure transducer 10 of the present invention with the cover 36 attached to the housing 12. With reference to both FIGS. 6 and 7, it can be seen that the attachment between the cover 36 and the housing 12 is achieved through the association of the snap acting connectors 38 with the tabs 40 on two sides of the transducer. It can also be seen that the recess 60 of both the cover 36 and the housing 12, located between feet 50 and 52, permits the transducer to be supported in noncontact relation with an external object to which the feet, 50 and 52, are attached. The separation between the transducer and the external object which is provided by the recess 60 further isolates the pressure transducer 10 from stresses which could originate in the external object. In addition, the recess 60 permits the transducer to be attached to external objects which are not completely flat and uniform without introducing stresses in the package. It should be noted that another recess 160 is provided between feet 54 and 56 on the major surface shown in FIG. 7. Therefore, when feet 54 and 56 are used to attach the pressure transducer 10 to an external object, such as a printed circuit board, the recess 160 maintains the pressure transducer in noncontact association with that external object to isolate it from full contact with the external object and prevent stresses from being transmitted easily from the external object to the pressure transducer. It should be noted, by comparing FIGS. 6 and 7, that the terminals, 64, 66 and 68, can extend from the housing in a solely perpendicular manner as illustrated in FIG. 7 or, alternatively, the terminals can be bent at right angles to extend in parallel with their support side of the housing 12, as shown in FIG. 6. It should further be understood that when the terminals are bent to form the configuration shown in FIG. 6 the forces required to perform the bend in each terminal could be transferred through the housing wall to the ceramic plate if the ceramic plate was in direct physical contact with the terminals. However, the present invention separates the terminals from the ceramic plate and utilizes flexible electrical conductors to connect the two in electrical communication with each other. Therefore, the forces necessary to bend the terminals do not transmit stress through the terminals to the ceramic plate.

Figure 8:
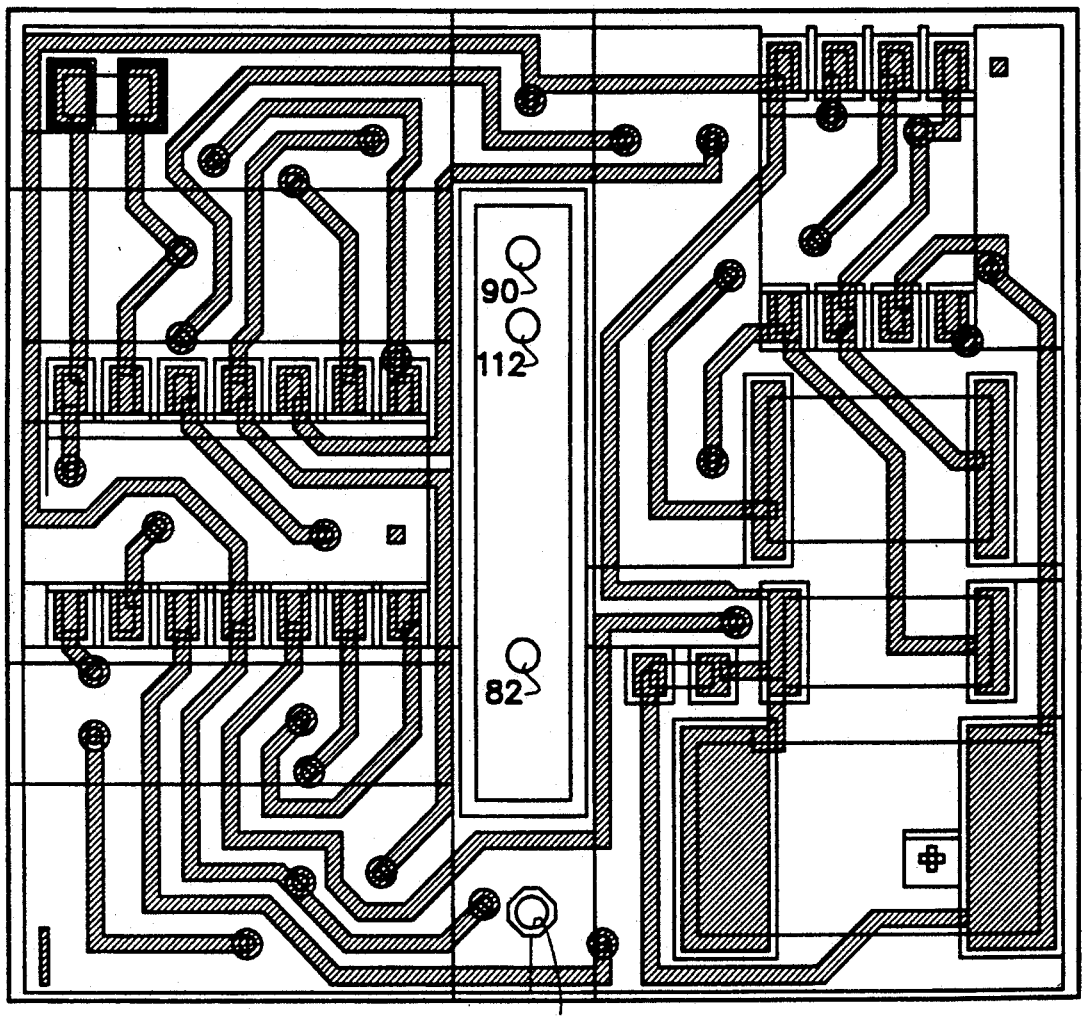
FIG. 8 represents the first surface of the ceramic plate of the present invention.

In a preferred embodiment of the present invention, the ceramic plate 28, or board, comprises a double-sided, screen printed circuit with a plurality of surface mounted components attached to its surface. An exemplary showing of these components is provided in FIGS. 8 and 9. FIG. 8 shows the first side 100 of the ceramic plate 28 with the openings 82, 90, 112 and 116 which have been described in detail above. The central region 180 of the first side 101 is identified by a rectangle in FIG. 8 to illustrate the portion of the first side 101 which is placed in contact with the raised area 25 of the boss 24. All portions of the ceramic plate 28 outside the rectangle 180 are supported in a cantilevered manner in noncontact relation with all portions of the housing 12. It can be seen that a plurality of conductive paths and electronic component positions are shown in FIG. 8. The circuit components of the amplification and compensation circuits are disposed on the ceramic plate 28. It should be understood that alternative configurations of the component locations and conductive paths are within the scope of the present invention.

Figure 9:
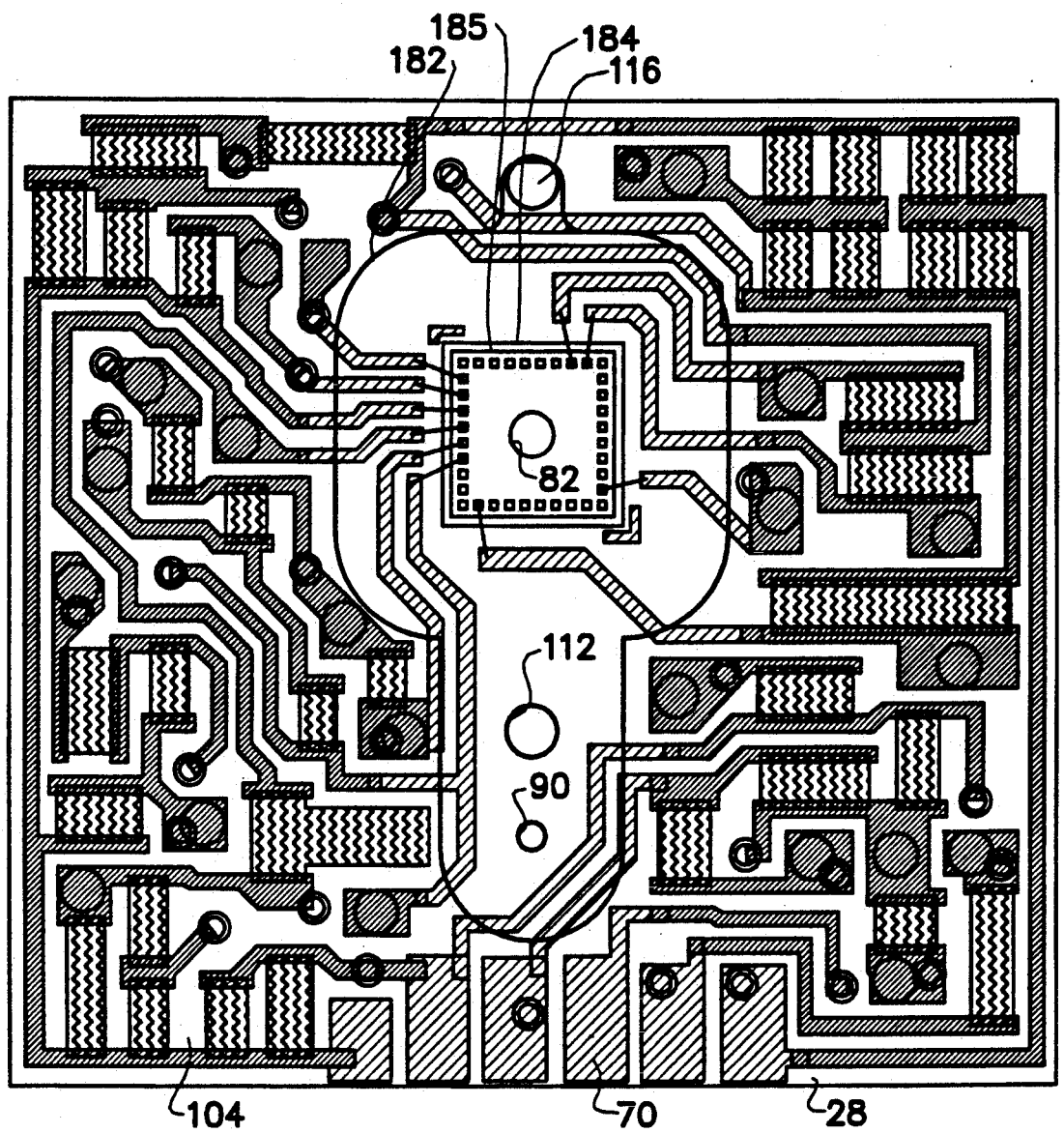
FIG. 9 represents the second surface of the ceramic plate of the present invention.

FIG. 9 shows the second side 104 of the ceramic plate 28 with the openings 82, 90, 112 and 116 which have been described above in detail. Reference number 182 identifies the location of the cap 34 and reference number 184 identifies the location of the buffer plate 30 and reference number 185 identifies the location of the pressure sensor 32. The illustration of FIG. 9 also shows a plurality of conductive paths and trimmable resistors of the amplification and compensation circuit. The trimmable resistors are accessible for testing and adjustment after the transducer 10 is completely assembled, but before the cover 36 is attached to the housing 12.

In both FIGS. 8 and 9, components and conductive paths are not identified with specific reference numbers because these illustrations are intended to show an exemplary configuration of the conductive paths and component locations that can be used to provide the amplification and compensation circuits of an amplified pressure transducer. More importantly, FIGS. 8 and 9 demonstrate how the present invention provides a means for supporting the internal components of a pressure transducer in noncontact relation with a housing to minimize the transmission of stress and strain from the housing to the diaphragm of the pressure sensor. This overall structure provides numerous stress isolators between the pressure sensor diaphragm and the sources of both thermally and mechanically induced stress.

The electrical circuit which comprises the plurality of mounted components is used to amplify and compensate the output of the pressure sensor 32. The amplification is necessary to provide an output signal that is significantly higher in magnitude than the relatively small signal provided directly by the sensor. The compensation circuitry is necessary to compensate for temperature variations which could affect the piezoresistive characteristics of the components disposed on the diaphragm. The thin silicon buffer plate 30 is provided with a cavity 96 in its center and is bonded to the ceramic plate with a layer of soft adhesive. The pressure sensor 32 is then bonded to the buffer plate with a soft, or flexible, adhesive. The electrical connection between the ceramic substrate and the pressure sensor is performed with gold wirebonds in a most preferred embodiment of the present invention. The plastic cap 34 is disposed over the pressure sensor and the buffer plate in order to protect the pressure sensor and the wirebonds and also to create a sealed pressure chamber 120 around the upper surface of the pressure sensor 32. The use of the cap 34 to make the top pressure seal permits access to various test points on the second surface of the ceramic plate which are needed for differential pressure and temperature testing prior to the placement of the cover 36 on the housing 12.

The cap 34 is provided with the two pins, 108 and 110, which pass through the holes, 112 and 116, in the ceramic plate 28 and into holes, 114 and 118, in the boss 24 of the housing. The use of these pins serves to align the ceramic plate in the housing and with the pressure responsive components on the ceramic plate. The pressure device 26, which comprises the ceramic plate 28, the buffer plate 30, the pressure sensor 32 and the cap 34, is then bonded to the raised area 25 of the support boss 24 through the use of a flexible adhesive. The two protruding ports shown in the figures permit the first and second conduits, 76 and 86, to be connected to pressure regions external to the housing. One port is connected to the first side, or cavity side, of the pressure sensor diaphragm and the other port is connected to the second side, or active side, of the diaphragm. When the present invention is configured as shown in FIG. 4, without the cover 36, all necessary sensitivity, zero offset and temperature compensation perimeters can be adjusted and tested because the components on the upper side of the ceramic plate 28 are readily accessible. After this adjustment and testing is complete, electrical connections are made between the terminals, 64, 66 68 and the conductive pads 70. After these connections are complete, through the use of flexible conductors 122, the cap 36 is snapped onto the housing 12.

The present invention provides a pressure transducer which is of a relatively small size and which is durable and has a high sensitivity to pressure with a low amplifier gain. The pressure transducer exhibits a high accuracy with a low sensitivity to stress and permits mounting to external objects in various configurations. Because of the high sensitivity of the silicon pressure sensor used in the present invention, one of the most important features is its low sensitivity to stress. The characteristics described above combine to isolate the pressure sensor from virtually all sources of stress transmission. For example, the flexible electrical connections between the terminals and the conductive pads of the ceramic plate permit no stress transmission from the terminals to the pressure sensor. The pressure sensor die is also isolated from the ceramic plate by the buffer plate which is positioned between the two with the three components being attached together with a soft flexible adhesive. The pressure sensor die is located on the ceramic directly above the location where the ceramic is attached to the boss or supporting rib in the housing. The supporting rib, or boss, is not connected to the side walls of the housing and therefore provides additional stress isolation between the pressure sensor and the housing. The ceramic plate is attached to the boss with a soft flexible adhesive to mechanically connect the ceramic to the housing as well as to maintain a pressure seal around the components which comprise the conduits. The clearance around the edges of the ceramic plate between the ceramic and the housing permits the housing walls to deform substantially without affecting the position of the ceramic plate. The mounting features, comprising the feet, are included as part of the cover instead of the housing. Therefore, after the cover is snapped onto the housing, the housing is disposed from any external device to which the cover is attached. This further isolates the housing from the external device to prevent stresses from being transmitted to the housing. In addition, the use of the snap acting contacts to attach the cover to the housing provides an additional isolation to the transmission of stress between the cover and the housing.

Although the present invention has been described with significant specificity and illustrated to show a particularly preferred embodiment, it should be understood that alternative embodiments are within its scope.

The embodiments of the invention in which an exclusive property or right is claimed are defined as follows:

1. A pressure transducer, comprising:
 a housing having a base surface and a plurality of walls attached to said base surface;
 a support boss attached to said base surface;
 a pressure sensitive device attached to said support boss with said support boss being disposed in contact with a central portion of a first surface of said pressure sensitive device, said pressure sensitive device being supported by said support boss in noncontact association with said plurality of walls;
 first means for connecting said pressure sensitive device in fluid communication with a first region external to said housing;
 a plurality of electrically conductive terminals rigidly attached to said housing and extending from a first position proximate said pressures sensitive device to a second position external to said housing; and
 a cover attached to said housing to enclose said pressure sensitive device between said housing and said cover, said pressure sensitive device comprising a ceramic member and a pressure sensor disposed on said ceramic member, a first surface of said ceramic member being said first surface of said pressure sensitive device, said pressure sensitive device further comprising a cap disposed on a second surface of said ceramic member, said pressure sensor being disposed between said cap and said second surface.

2. The transducer of claim 1, wherein:
 said pressure sensitive device further comprises a buffer plate disposed between said second surface and said pressure sensor.

3. The transducer of claim 2, wherein:
 said buffer plate is attached to ceramic member with flexible adhesive, said pressure sensor is attached to said buffer plate with flexible adhesive and said ceramic member is attached to said support boss with flexible adhesive.

4. The transducer of claim 2, wherein:
 said pressure sensor comprises a diaphragm disposed in fluid communication with said connecting means.

5. The transducer of claim 4, further comprising:
 flexible electrical conductors connected in electrical communication between said terminals and said ceramic member.

6. The transducer of claim 5, wherein:
 said first connecting means is connected in fluid communication with a first side of said diaphragm of said pressure sensor.

7. The transducer of claim 6, further comprising:
 a second means for connecting a second side of said diaphragm of said pressure sensor in fluid communication with a second region outside said housing.

8. The transducer of claim 7, wherein:
 said first connecting means comprises a first opening extending through said ceramic member in fluid communication with a cavity of said buffer plate and said first side of said diaphragm of said pressure sensor and said second connecting means comprises a second opening extending though said ceramic member in fluid communication with said second side of said diaphragm of said pressure sensor.

9. The transducer of claim 7, wherein:
 said flexible electrical conductors are made of gold.

10. The transducer of claim 1, wherein:
 said cover comprises a first means for attaching said transducer to an object, said first attaching means being shaped to support said housing in noncontact association with said object.

11. The transducer of claim 10, wherein:
 said cover further comprises a second means for attaching said transducer to said object, said second attaching means being shaped to support said housing in noncontact association with said object.

12. The transducer of claim 1, wherein:
 said cover and said housing are removably attached together with a plurality of snap acting connectors.

13. A pressure transducer, comprising:
 a housing;
 a boss extending from said housing;
 a pressure sensitive device attached for support to said boss;
 a first conduit connecting said pressure sensitive device in fluid communication with a first region external to said housing;
 an electrically conductive terminal attached for support to said housing and extending through said housing from a first position proximate said pressure sensitive device to a second position external to said housing;
 a cover attached to said housing, said pressure sensitive device being disposed between said housing and said cover, said pressure sensitive device being supported by said boss in noncontact association with said housing and said cover; and
 first means for attaching said transducer to an object, said first attaching means being configured to support said housing in noncontact relation with said object.

14. The transducer of claim 13, further comprising:
 said means for attaching said transducer to said object, said second attaching means being configured to support said housing in noncontact relation with said object.

15. The pressure transducer of claim 13, wherein:
 said pressure sensitive device comprises a ceramic plate having a first side attached to said boss and a second side having a pressure sensor disposed thereon, said conduit being connected in fluid communication with said pressure sensor.

16. The transducer of claim 15, wherein:
 a buffer plate is disposed between said pressure sensor and said second side of said ceramic plate, said buffer plate having a cavity, said conduit being connected in fluid communication with said cavity.

17. The transducer of claim 16, wherein:
 said pressure sensor comprises a diaphragm which is pressure responsive, said diaphragm having a first side and a second side.

18. The transducer of claim 16, further comprising:
 a flexible electrical conductor connected in electrical communication between said terminal and said ceramic plate.

19. The transducer of claim 18, wherein:
said conduit extends through said boss in fluid communication with said first side of said diaphragm.

20. The transducer of claim 19, further comprising:
a cap disposed on said second side of said ceramic plate, said pressure sensor being disposed between said cap and said second side of said ceramic plate.

21. The transducer of claim 20, further comprising:
a second conduit connected in fluid communication with a second side of said diaphragm, said second conduit extending through said boss.

22. The transducer of claim 21, wherein:
said first conduit extends through a first opening in said ceramic plate and said second conduit extends through a second opening in said ceramic plate.

23. The transducer of claim 16, wherein:
said buffer plate is attached to said ceramic plate with a flexible adhesive, said pressure sensor is attached to said buffer plate with flexible adhesive and said ceramic plate is attached to said boss with flexible adhesive.

24. A pressure transducer, comprising:
a housing;
a boss attached to said housing;
a pressure sensitive device attached to said boss;
a first conduit extending through a portion of said housing and through a portion of said boss, said conduit being connected in fluid communication with said pressure sensitive device and with a first region external to said pressure transducer;
an electrically conductive terminal attached to said housing and extending through a portion of said housing, one end of said terminal being proximate and said pressure sensitive device;
a cover attached to said housing, said pressure sensitive device being disposed between said housing and said cover, said pressure sensitive device being supported by said boss in noncontact relation with said housing and said cover; and
first means attached to said cover for supporting said housing in noncontact relation with an object.

25. The transducer of claim 24, wherein:
said first supporting means comprises a first plurality of feet extending from said cover.

26. The transducer of claim 25, further comprising:
second means attached to said cover for supporting said housing in noncontact relation with said object.

27. The transducer of claim 26, wherein:
said second supporting means comprises a second plurality of feet extending from said cover.

28. The transducer of claim 24, further comprising:
a flexible electrical conductor connected in electrical communication with said terminal and said pressure sensitive device.

29. The transducer of claim 24, wherein:
said pressure sensitive device comprises a ceramic plate with a first side and a second side, said first side being attached to said boss, said pressure sensitive device further comprising a pressure sensor disposed on said ceramic plate, said pressure sensor being disposed in fluid communication with said first conduit.

30. The transducer of claim 29, wherein:
said pressure sensitive device further comprises a buffer plate, said buffer plate having an opening extending therethrough, said opening being in fluid communication with said conduit and said pressure sensor.

31. The transducer of claim 29, wherein:
said pressure sensor comprising a diaphragm having a first side and a second side, said first side being disposed in fluid communication with said first conduit.

32. The transducer of claim 31, further comprising:
a second conduit extending through said housing and said boss, said second conduit being in fluid communication with said second side of said diaphragm and a second region external to said pressure transducer, said second conduit comprising an opening through said ceramic plate.

33. The transducer of claim 29, further comprising:
a cap disposed on said second side of said ceramic plate, said cap comprising a portion of said second conduit.

34. The transducer of claim 24, wherein:
said cover and said housing are separably attached together.

35. The transducer of claim 34, wherein:
said cover and said housing are attached together with pressure activated clips.

36. The transducer of claim 24, further comprising:
means for attaching said pressure transducer to a circuit board.

* * * * *

UNITED STATES PATENT AND TRADEMARK OFFICE
CERTIFICATE OF CORRECTION

PATENT NO. : 5,257,547

DATED : November 2, 1993

INVENTOR(S) : Gregory S. Boyer

It is certified that error appears in the above-indentified patent and that said Letters Patent is hereby corrected as shown below:

Claim 1, line 16 (line 28 of column 13), delete "pressures" and substitute therefor - -pressure - -.

Signed and Sealed this

Fourteenth Day of June, 1994

Attest:

BRUCE LEHMAN

Attesting Officer

Commissioner of Patents and Trademarks